United States Patent [19]

Aikawa

[11] Patent Number: 5,481,204
[45] Date of Patent: Jan. 2, 1996

[54] CONNECTOR TERMINAL CHECKING DEVICE AND METHOD OF CHECKING CONNECTOR TERMINAL

[75] Inventor: Jiro Aikawa, Shizuoka, Japan

[73] Assignee: Yazaki Corporation, Japan

[21] Appl. No.: 293,803

[22] Filed: Aug. 22, 1994

[30] Foreign Application Priority Data

Aug. 20, 1993 [JP] Japan .................................. 5-206334

[51] Int. Cl.⁶ ................................................. G01R 31/04
[52] U.S. Cl. ........................... 324/756; 324/538; 439/489; 439/488
[58] Field of Search .................................. 439/488, 489; 324/758, 538, 537, 756

[56] References Cited

U.S. PATENT DOCUMENTS

| | | | |
|---|---|---|---|
| 4,232,262 | 11/1980 | Emo | 324/538 |
| 4,573,011 | 2/1986 | Rochat | 324/758 |
| 4,902,968 | 2/1990 | Sugimoto . | |
| 5,335,413 | 8/1994 | Yamamoto | 324/538 |

FOREIGN PATENT DOCUMENTS

| | | |
|---|---|---|
| 55-8221 | 2/1980 | Japan . |
| 2-5383 | 1/1990 | Japan . |

Primary Examiner—Kenneth A. Wieder
Assistant Examiner—Jose M. Solis
Attorney, Agent, or Firm—Wigman, Cohen, Leitner & Myers

[57] ABSTRACT

A connector terminal checking device includes a base, a conduction checking part rotatably supported by the base to check the conductive condition of a connector to be checked, an abutting part attached to the base to come into contact with a rear end of the connector mounted on the conduction checking part arranged in a conduction check position, a compression spring for urging the conduction checking part against a stand-by position and a solenoid for holding the conduction checking part in the conduction check position when checking the connector. In an initial state of the device, the solenoid is not energized, so that the conduction checking part is moved in the stand-by position by the compression spring. After the connector is inserted into the conduction checking part, it is pressed to the conduction check position by an operator. During checking, the solenoid is energized to maintain the conduction checking part in the conduction checking position. After checking, the solenoid is inactivated, so that the conduction checking part is raised from the base by the compression spring.

18 Claims, 5 Drawing Sheets

CONNECTOR TERMINAL CHECKING DEVICE AND METHOD OF CHECKING CONNECTOR TERMINAL

BACKGROUND OF THE INVENTION

The present invention relates to the improvement in a connector terminal checking device for method of checking terminals in a connector for use in connection of wire harnesses or electrical instruments in an automobile or the like.

In such a connector, female or male terminals are accommodated in terminal receiving chambers formed in a connector housing of the connector, and these terminals are retained in so-called a terminal lance or case lance manner so as to prevent the terminals from being drawn off from the terminal receiving chambers. The female or male terminal is fitted with another male or female terminal connector to thereby obtain electrical connection between the female and male terminals in both the connectors. In using the connector, it is never permitted that the terminals will be drawn off by a tensile force or the like to be applied to electrical wires connected to the terminals, and that the electrical connection between the mating female and male terminals will become imperfect.

Under such circumstances, there has been proposed in Japanese Utility Model Publication No. 55-8221 and Japanese Patent Laid-open No. 2-5383 connector terminal checking devices each of which is capable of checking the mechanical and electrical engaged conditions of the terminals fixedly received in a multipolar connector accommodating a plurality of terminals in the terminal receiving chambers.

In operation of checking the mechanical and electrical engaged conditions of the terminals using the above-mentioned devices, however, there are contained an operation to attach the connector to be checked to a connector receiving part of the device, an operation to approach a detector main body to the connector attached to the connector receiving part and an operation to detach the connector after checking from the connector receiving part, so that the whole operation to check the conductivity of the terminals will be troublesome for an operator.

In addition, since the above connector receiving part is needed so as to be mounted on a base plate, the so-constructed connector terminal checking device is apt to be large-sized, so that the manufacturing cost increases.

SUMMARY OF THE INVENTION

It is therefore an object of the present invention to provide a connector terminal checking device and a checking method which is capable of making a conduction check of terminals of a connector easy and which is small-sized.

The object of the invention described above can be accomplished by a connector terminal checking device comprising:

a base;

a conduction checking part supported by the base so as to rotate between a stand-by position where a connector having connector terminals is attached and detached and a conduction check position where the conductive condition of the connector terminals is checked, the conduction checking part being provided with pins for checking the conduction;

an abutting part attached to the base so as to come into contact with a rear end of the connector mounted on the conduction checking part arranged in the conduction check position;

urging means for urging the conduction checking part against the stand-by position; and holding means for holding the conduction checking part in the conduction check position when checking the conduction of the connector terminals.

According to another aspect of the present invention, there is provided with a method of checking connector terminal, comprising the steps of:

mounting a connector with terminals on a conduction checking part of a checking device at a stand-by position;

pivoting the conduction checking part from a stand-by position to a conduction check position against an urging force of an urging means so that a rear end of the connector abuts on an abutting part of the checking device; and checking the conduction of the connector terminals with holding the conduction checking part in the conduction check position.

Other objects and features of the present invention will become more fully apparent from the following description and appended claims taken in conjunction with the accompanying drawings.

DESCRIPTION OF THE PREFERRED EMBODIMENT

Embodiments of the present invention is now described with reference to the drawings.

First Embodiment

Figure 1:
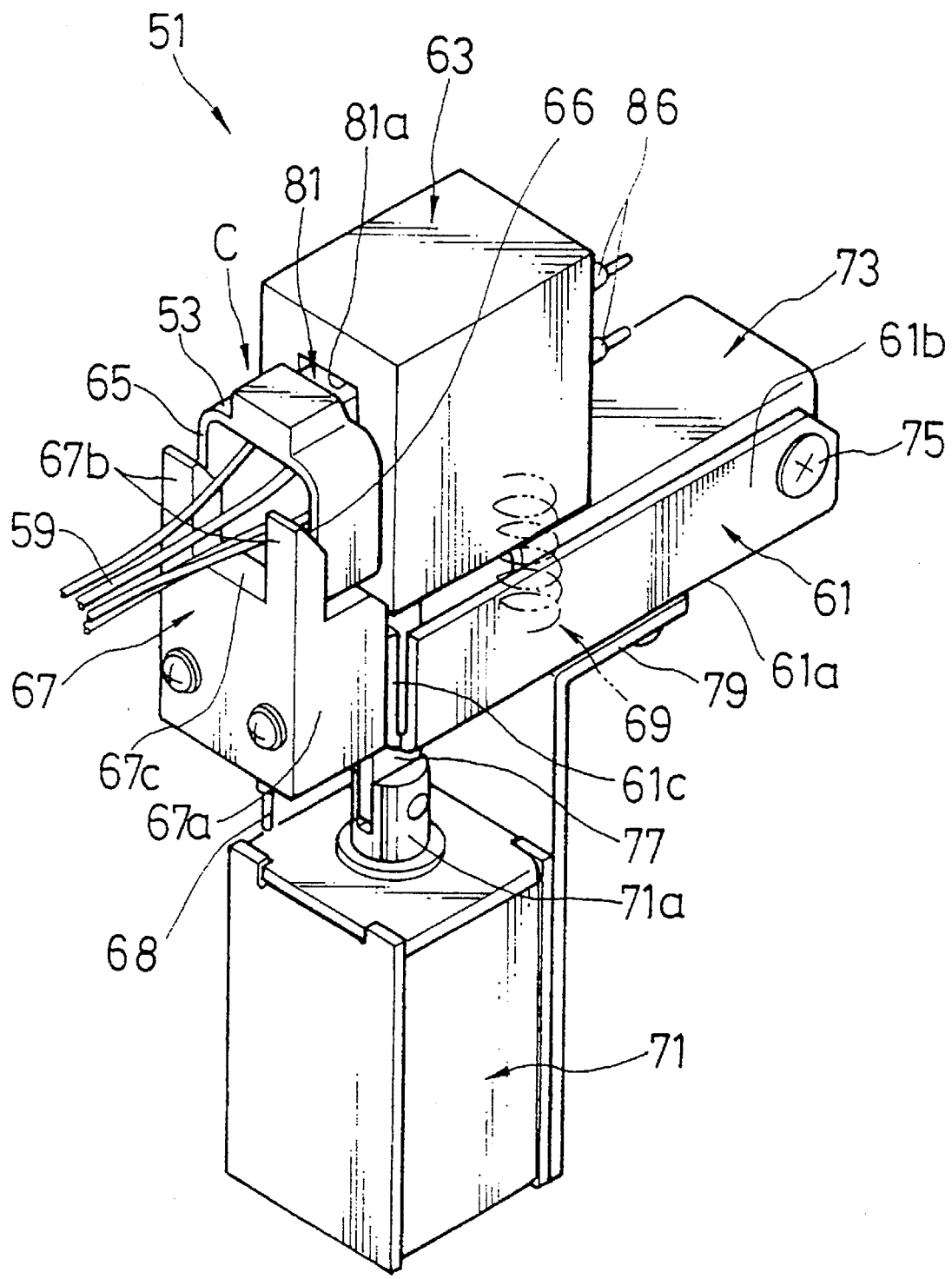
FIG. 1 is a perspective view showing a connector terminal checking device in accordance with a first embodiment of the present invention.
Figure 2A:
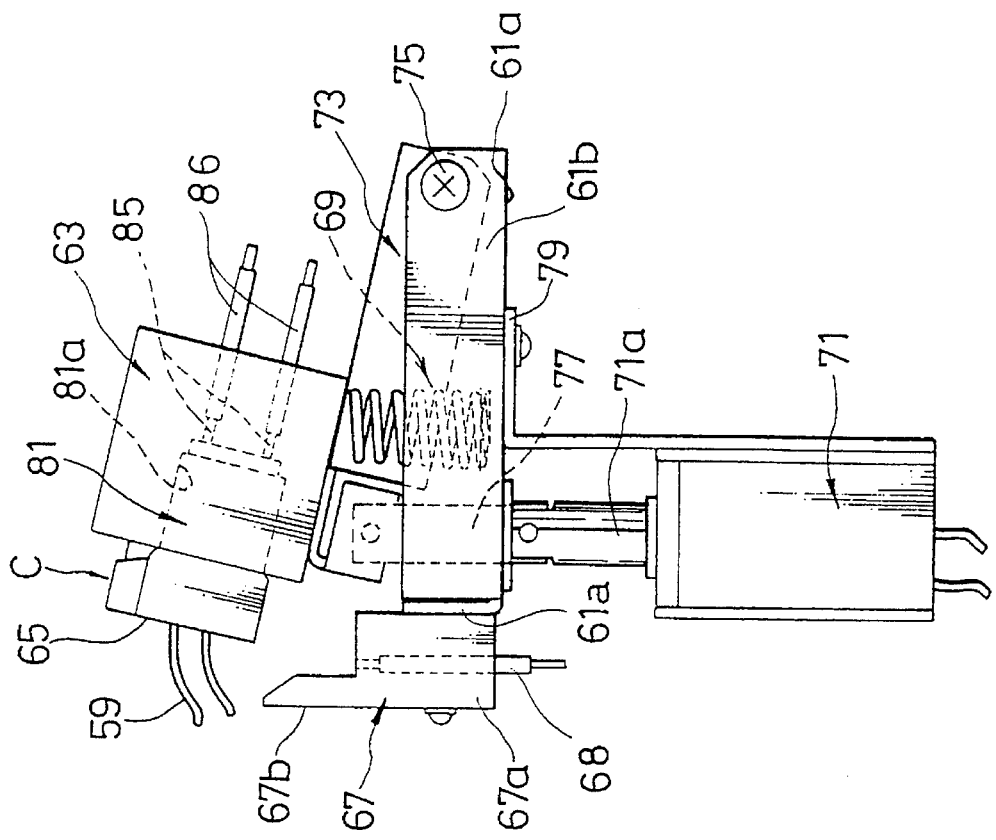
FIG. 2A is a side view showing the connector terminal checking device of the first embodiment, in which a conduction checking part is in a "check" position where the conductive condition of a connector is checked.

FIGS. 1 and 2 show a connector to be checked and a connector terminal checking device 51 for inspecting the conductive condition of terminals of the connector C.

Figure 3A:
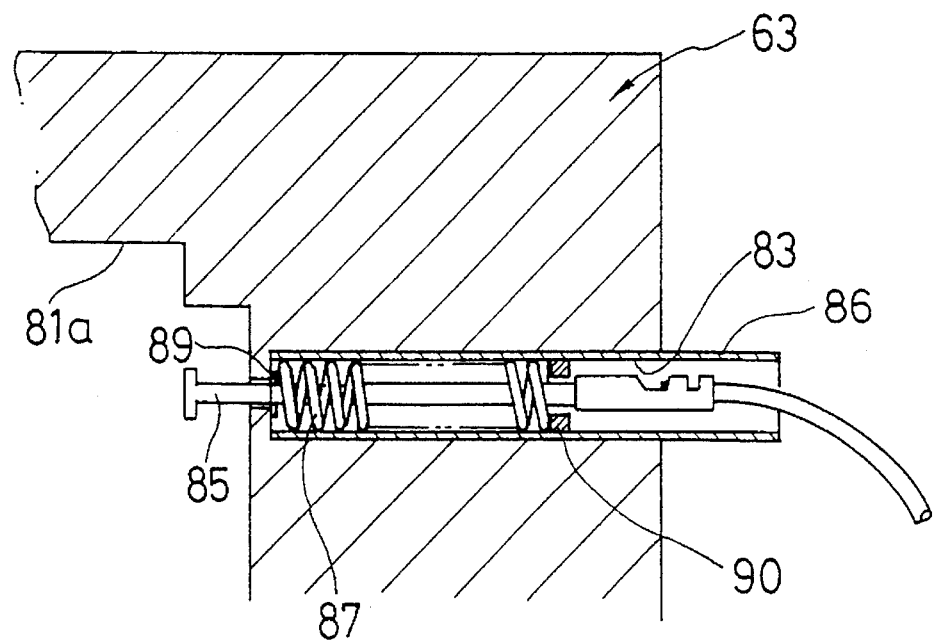
FIG. 3A is a cross sectional view showing a relationship in position between the conduction checking part and the connector, in which the connector is not inserted into a connector inserting part of the device.
Figure 3B:
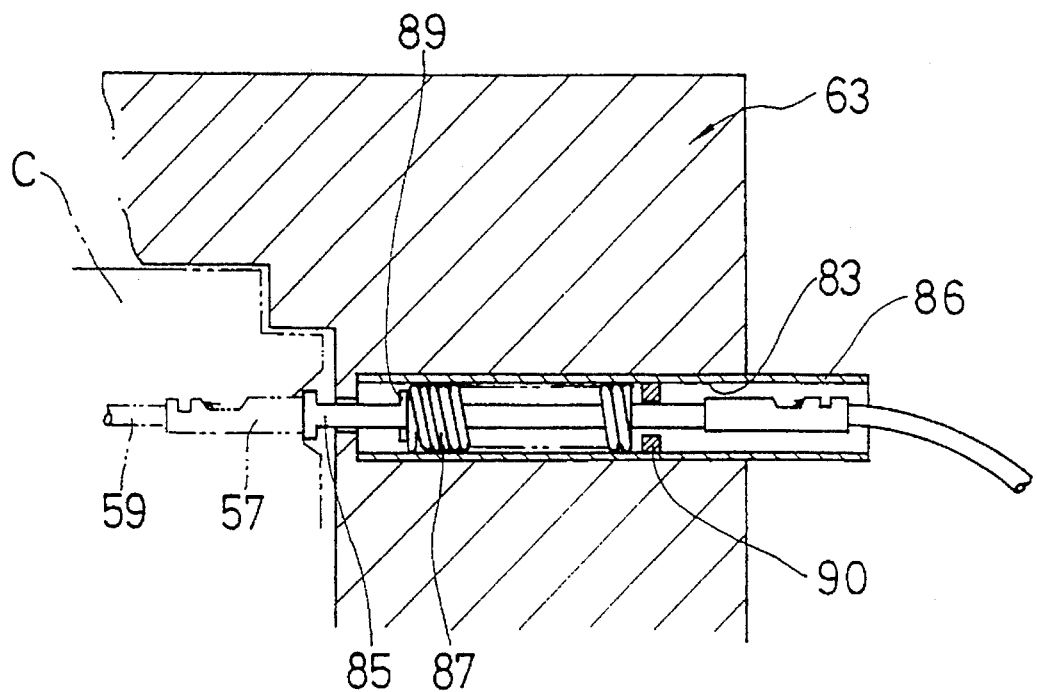
FIG. 3B is a cross sectional view showing a relationship in position between the conduction checking part and the connector, in which the connector is inserted into the connector inserting part of the device.

The connector C, which is so-called a female connector, includes a connector housing 53 provided with four terminal receiving chambers which are not shown in the figures and in which female terminals 57 (see FIG. 3B) are respectively accommodated. These female terminals 57 are crimped and electrically connected to respective ends of electrical wires.

As shown in FIGS. 1 and 2, the connector terminal checking device 51 consists of a base 61 and a conduction checking part 63 rotatably supported by the base 61 so as to rotate between a "stand-by" position where the connector is attached and detached and a "check" position where the conductive condition of the connector is checked. The device 51 further includes an abutting part 67 attached to the base 61 to come into contact with a rear end 65 of the connector C mounted on the conduction checking part 63 in the check position, a compression spring 69 for urging the conduction checking part 63 against the stand-by position and a solenoid (actuator) 71 for holding the part 63 in the check position when checking the terminals of the connector.

The base 61 is formed to have a substantially C-shaped cross section to include a bottom wall 61a and side walls 61b. An end of the base 61 in the longitudinal direction is closed by a part 61c of the bottom wall 61a, which is bent to the same direction as the side walls 61b. Arranged inside the base 61 is a stay 73 of the substantially same configuration as the base 61, which is shorter than that and which is rotatably supported by the side walls 61b through the intermediary of a pin 75.

The compression spring 69 is arranged between an inner wall of the stay 73 and the bottom wall 61a of the base 61 to urge the stay 73 to a direction apart from the base 61, pivoting on the center of the pin 75. Further, the stay 73 is connected with one end of a supporting lever 77. Extending downward through the bottom wall 61a, the other end of the lever 77 is connected to a plunger of the solenoid 71. The solenoid 71 is carried on the bottom wall 61a of the base 61 through an L-shaped bracket 79.

When it is energized, the solenoid 71 holds the stay 73 in such a position as to minimize an angle thereof with respect to the base 61, i.e., in the check position. On the other hand, when the solenoid 71 is inactivated, the stay 73 is rotated to such a position as to maximize the angle thereof with respect to the base 61, i.e., to the above stand-by position. The conduction checking part 63 is fixed on an upper face of the stay 73.

The conduction checking part 63, having a cubic shape, is provided on a first surface thereof with a connector inserting part 81 into which the connector is inserted. The connector inserting part 81 has a recess 81a a shape of which is substantially identical to the outer profile of the connector C. Further, the conductor checking part 63 is provided on a bottom of the recess 81a with four through holes 83 (FIGS. 3A, 3B) which communicate with the bottom of recess 81a on one hand and open to the other surface of the part 63 on the other hand. Accommodated in the respective through holes 83 are conduction checking test pins 85 each of which has one end protruding into the recess 81a and the other end electrically connected to the electrical wire 59.

Each conduction checking pin 85 is accommodated in a tube 86 fitted in the through holes 83 in such a manner that the pin 85 is equipped with a compression spring 87. The tube 86 is provided on an inner wall in an axially central portion with a stop 90 with which one end of the compression spring 87 is brought into contact. The other end of the compression spring 87 comes into contact with a flange 89 formed on the conduction checking pin 85, whereby the spring 87 urges the flange 89 of the pin 85 against the conduction checking part 63. In checking, the connector C to be checked, particularly, a front part thereof is inserted into the connector inserting part 81 and then retained between the part 81 and the abutting part 67.

The abutting part 67 is fastened with screws on a side wall 61c closing the opening of the base 61. The abutting part 67 comprises a fixing portion 67a for the base 61 and abutting portions 67b protruding from the fixing portion 67a to come into contact with the rear end of the connector C. A checker 68 is embedded in the fixing portion 67a. This checker 68 detects accessories attached to the rear part of the connector C, such as a rear holder or the like. Formed at the center of the abutting portion 67a is a recess 67c which opens upward and through which the electrical wires 59 extend out of the rear part of the connector C pass. Slants 66 are formed on respective upper ends of the abutting portions 67b to face a connector inserting part 81. The abutting part 67 is brought into contact with the rear part of the connector C when it installed in the connector inserting part 81 is supported in the conduction checking position, in other words, when checking the conductive condition of the connector C.

Figure 2B:
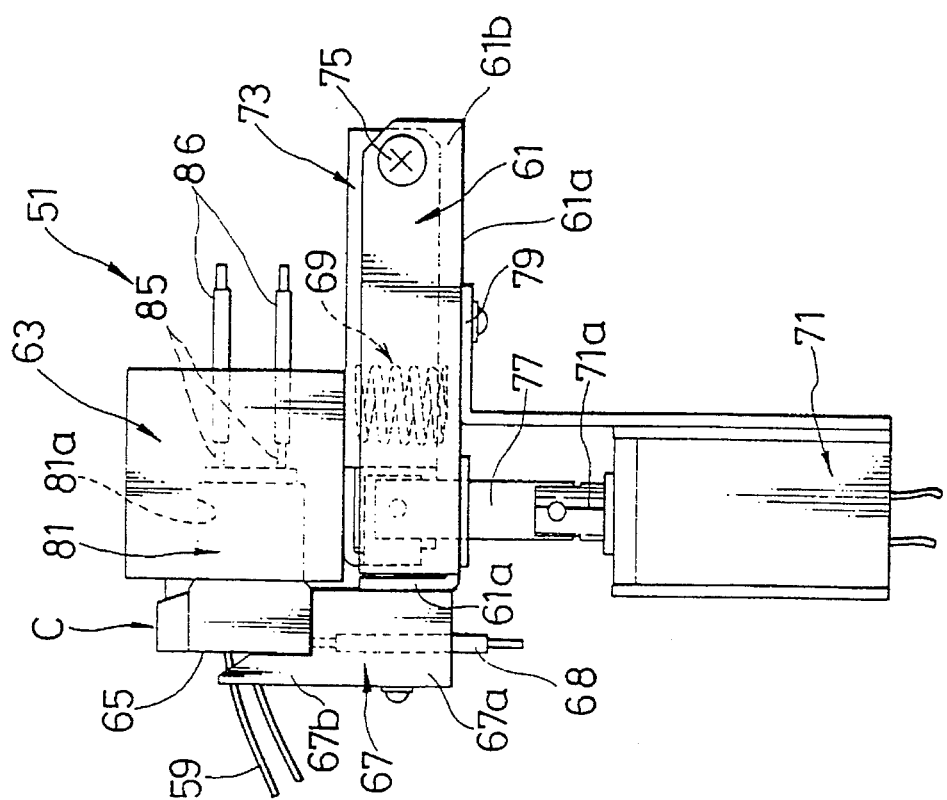
FIG. 2B is a side view showing the connector terminal checking device of the first embodiment, in which the conduction checking part is in a "stand-by" position where the connector is attached or detached.

Next, we describe a method for checking the conductive condition of the connector C, using the above mentioned connector terminal checking device 51. It should be noted that, in an initial state of the connector terminal checking device 51, the solenoid 71 is not energized, so that the stay 73 is rotated by the urging force of the compression spring 69 to maximize the angle of the stay 73 with respect to the base 61 as shown in FIG. 2B and the conduction checking part 63 to which the connector is attached and detached therefrom is in the stand-by position. In addition, the conduction checking pins 85 of the part 63 protrude into the recess 81a of the connector inserting part 81 at predetermined lengths, respectively.

Under the above mentioned condition, after being aligned with the recess 81a of the part 81, the connector C is inserted into the recess 81a so that the conduction checking pins 85 are brought into contact with the connector terminals 57. Thereafter, the connector C is further inserted into the heart of the part 81, opposing the urging force of the compression spring 87.

Next, the conduction checking part 63 is pressed against the base 61 so that the part 63 is rotated to the conduction checking position. Consequently, the rear part of the connector C installed in the part 81 is brought into contact with the abutting part 67 and then the solenoid 71 is energized to maintain the conduction checking part 63 in the conduction checking position. Under such a condition, whether the connector terminals are conductive or not is checked by supplying the pins 85 with electricity.

After the conduction check of the connector terminals 57 is finished, the solenoid 71 is inactivated so that the stay 73 is raised from the base 61 by the urging force of the compression spring 69 to thereby rotate the conduction checking part 63 to the stand-by position. When the conduction checking part 63 is rotated to the stand-by position, the rear part of the connector installed in the connector inserting part 81 is detached from the abutting part 67 and pressed out of the recess 81a of the part 81 by the urging force of the compression spring 87.

According to the embodiment, if only the connector C is inserted into the connector inserting part 81 to rotate the conduction checking part 63 to the conduction checking position, it allows the connector C to be attached to the connector terminal checking device 51. Similarly, if only the solenoid 71 is inactivated, it allows the connector C to be detached from the device 51. Therefore, by the above mentioned reason, the operational efficiency of conduction check can be increased.

Further, if a wire harness checking device is provided with a plurality of connector terminal checking devices 51 of the invention, it is possible to check a plurality of connectors C at a time by activating the solenoids installed in the devices 51 at the same time, whereby the operational efficiency of conduction check can be increased.

In the connector terminal checking device 51, the checker 68 allows the accessories of the connector C to be detected.

In case of using the present connector terminal device as an instrument for checking the other connector terminal, only the conduction checking part 63 may be replaced with the other part and therefore, it is not required to change the stay 73 and the abutting part 67 of the present device to the other parts, whereby a cost for checking the other connector terminal can be saved.

Second Embodiment

Figure 4:
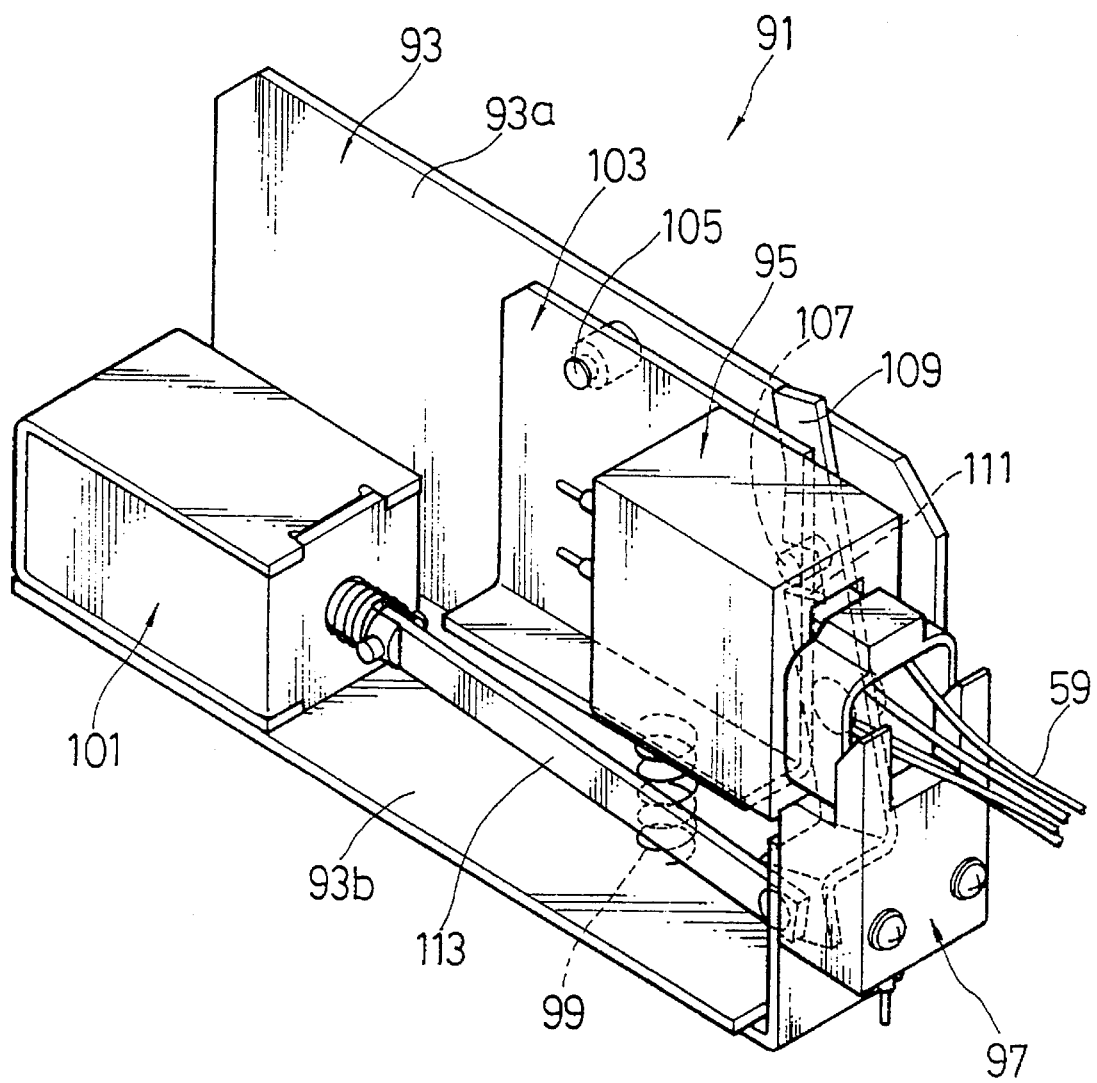
FIG. 4 is a perspective view showing a connector terminal checking device in accordance with a second embodiment of the present invention.
Figure 5A:
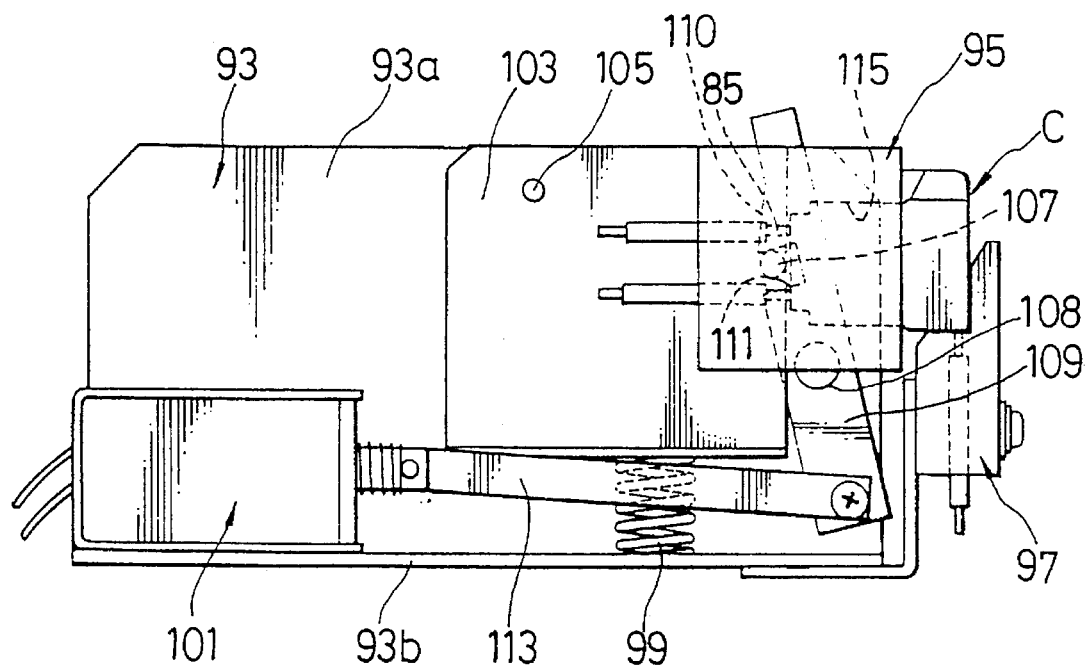
FIG. 5A is a side view showing the connector terminal checking device of the second embodiment, in which a conduction checking part is in a "check" position where the conductive condition of the connector is checked.
Figure 5B:
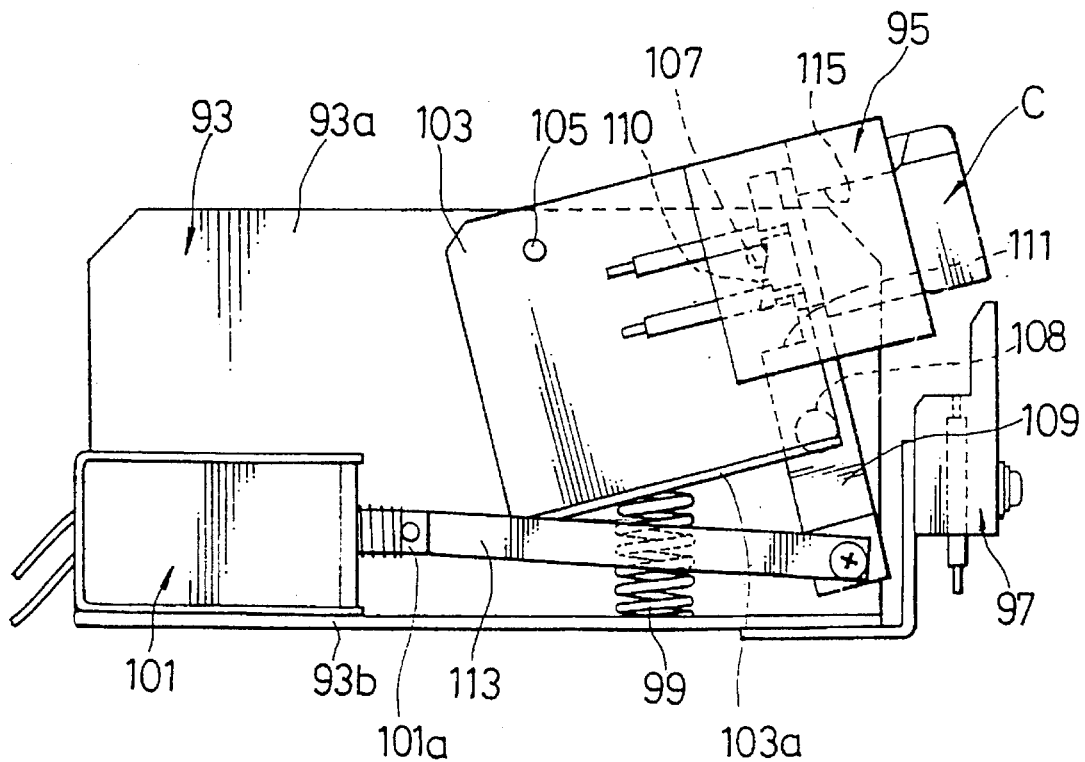
FIG. 5B is a side view showing the connector terminal checking device of the first embodiment, in which the conduction checking part is in a "stand-by" position where the connector is attached or detached.

We now describe a second embodiment of the invention with reference to FIGS. 4, 5A and 5B, each of which shows the connector C and a connector terminal checking device 91 in accordance with the second embodiment of the present invention. The connector terminal checking device 91 consists of a base 93 and a conduction checking part 95 supported by the base 93 so as to rotate between a stand-by position where the connector C is attached and detached and a check position where the conductive condition of the connector C is checked. The device 91 further includes an abutting part 97 attached to the base 93 to come into contact with a rear end of the connector C mounted on the conduction checking part 95 in the above check position, a compression spring 99 for urging the conduction checking part 63 against the above stand-by position and a solenoid 101 for supporting the part 95 in the check position when checking the terminals of the connector.

The base 93, which is made by a flat plate, has a bottom wall 93a deformed so as to be of L-shape. A side plate 103 is pivotably mounted on the base 93 by a pin 105. Similarly, the side plate 103 has a bottom wall 103a deformed to be of an L-shape. The compression spring 99 is arranged between the bottom wall 93a of the base 93 and the bottom wall 103a of the side plate 103 to urge the side plate 103 about the pin 105 in a counter clockwise direction of FIGS. 5A and 5B. Further, the side plate 103 is provided on a surface thereof facing the bottom wall 93a with an engagement pin 107 which projects therefor. The engagement pin 107 is engaged into a recess formed in a lock lever 109 which is rotatably mounted on the base 93 about a pin 108. As shown in FIG. 4, the lock lever 109 has an end portion which is bent so as to be apart from the base 93 and which is connected to an end of a connecting rod 113. The other end of the connecting rod 113 is connected to a plunger 101a of the solenoid 101 mounted on a surface 93b of the base 93.

When the solenoid 101 is not energized, it projects the plunger 101a so as to allow the recess 111 of the lock lever 109 to be engaged with the engagement pin 107. On the other hand, when the solenoid 101 is energized, it draws up the plunger 101a to rotate the lock lever 101 in a clockwise direction of FIGS. 5A and 5B. Consequently, the engagement pin 107 is disengaged out of the recess 111, so that the side plate 103 is rotated by the compression spring 99, as shown in FIG. 5B. Note that, the conduction checking part 95 in the embodiment is fixed on the side plate 103 and indirectly supported by the base 93 through the intermediary of the plate 103. Further, the lock lever 109 is provided in the vicinity of the recess 111 with a slant 110 for facilitating the engagement of the engagement pin 107 into the recess 111.

Since the conduction checking part 95 is identical to the afore-mentioned conduction checking part 63 of the first embodiment, descriptions in construction and operation thereof are eliminated. In addition, descriptions of the abutting part 97 is eliminated because of its identity to the abutting part 67 of the first embodiment.

Further, according to the invention, since each of the engaging projections is provided at a front end thereof with the slanted surface, it is possible to execute the inserting operation of the leaf spring with ease thereby improving the workability of assembling the leaf spring.

Next, we describe a method for checking the conductive condition of the connector C, using the above mentioned connector terminal checking device 91. It should be noted that, in an initial state of the connector terminal checking device 91, the solenoid 71 is not so energized that the engagement pin 107 is disengaged from the recess 111 as shown in FIG. 5B and the conduction checking part 95 is in the stand-by position where the connector is attached and detached therefrom. In addition, the conduction checking pins 85 of the part 95 projects into a recess 115a of a connector inserting part 115 at predetermined lengths, respectively.

Under the above mentioned condition, after being aligned with the recess 115a of the part 115, the connector C is inserted into the recess 115a so that the conduction checking pins 85 are brought into contact with the connector terminals. Thereafter, the connector C is further inserted into the heart of the part 115, opposing the urging force of the compression spring 87.

Next, the conduction checking part 95 is rotated to the conduction checking position to engage the engagement pin 107 into the recess 115a of the lock lever 109. Consequently, the rear part of the connector C installed in the part 115 is brought into contact with the abutting part 97 and the connector C is held in the conduction checking position. Under such a condition, whether the connector terminals are conductive or not is checked by supplying the pins 85 with electricity.

After the conduction check of the connector terminals 57 (FIG. 3A) is finished, the solenoid 101 is energized so that the connecting rod 113 is drawn up to thereby rotate the lock lever 109 about the pin 108 in the clockwise direction. Since the lock lever 109 is rotated in the clockwise direction, the engagement pin 107 is disengaged from the recess 111, so that the holding of the conduction checking part 95 in the conduction check position is released. Correspondingly, the side plate 103 is rotated about the pin 105 in the counter clockwise direction, whereby the conduction checking part 95 is rotated to the stand-by position where the connector C is detached. With such a rotation, the rear part of the connector C can be detached from the abutting part 97 and pressed out of the connector inserting part 115 by the urging force of the compression spring 87.

According to the embodiment, if only the connector C is inserted into the connector inserting part 115 to rotate the conduction checking part 95 to the conduction checking position, it allows the connector C to be attached to the connector terminal checking device 91. Similarly, if only the solenoid 101 is energized, it allows the connector C to be detached from the device 51. Therefore, by the above mentioned reason, the operational efficiency of conduction check can be increased.

Further, if a wire harness checking device is provided with a plurality of connector terminal checking devices 91 of the invention, it is possible to check a plurality of connectors C at a time by activating the solenoids installed in the devices 51 at the same time, whereby the operational efficiency of conduction check can be increased.

Finally, it will be understood by those skilled in the art that the forgoing description of the preferred embodiments of the disclosed structure, and that various changes and modifications may be made to the present invention without departing from the spirit and scope thereof.

What is claimed is:

1. A connector terminal checking device comprising:

a base;

a conduction checking part supported by said base so as to rotate between a stand-by position where a connector having connector terminals is attached and detached and a conduction check position where the conductive condition of said connector terminals is checked, said conduction checking part being provided with pins for checking the conduction;

an abutting part attached to said base so as to come into contact with a rear end of said connector mounted on said conduction checking part arranged in said conduction check position, wherein said abutting part comprises abutting portions which are constructed so as to come into contact with the rear end of said connector and which are provided on respective upper ends thereof with slants for facilitating the contact of said abutting part with the rear end of said connector;

urging portion for urging said conduction checking part against said stand-by position; and holding portion for holding said conduction checking part in said conduction check position when checking the conduction of said connector terminals.

2. The connector terminal checking device of claim 1, wherein said urging means comprises a compression spring.

3. The connector terminal checking device of claim 1, wherein said holding means comprises a solenoid.

4. The connector terminal checking device of claim 1, wherein said abutting part has a checker for detecting accessories of said connector to be checked.

5. The connector terminal checking device of claim 1, wherein said holding means comprises a solenoid, and wherein said abutting part has a checker for detecting accessories of said connector to be checked.

6. The connector terminal checking device of claim 1, wherein said conduction checking part is provided with an engagement pin and wherein said holding means further comprises a lock lever associated with said solenoid to allow said engagement pin to be engaged.

7. The connector terminal checking device of claim 1, wherein said lock lever is provided with a recess which is capable of engaging with said engagement pin.

8. The connector terminal checking device of claim 1, wherein said lock lever is provided in the vicinity of said recess with a slant for facilitating the engagement of said engagement pin into said recess.

9. A method of checking connector terminals with a connector terminal checking device having a base portion having a free end, a stay having a free end pivotably joined therewith at common ends thereof, a solenoid adapted to draw the free ends together, and a compression spring adapted to urge the free ends apart from a conduction check position to a stand-by position whereat the solenoid is not energized so that the stay is urged by the compression spring to increase the angle of the stay with respect to the base and the conduction checking part to which a connector is to be attached to and detached from, comprising the steps of:

mounting the connector with terminals onto a conduction checking part supported by the stay;

pivoting the conduction checking part from the stand-by position to the conduction check position against an urging force of the compression spring so that a rear end of the connector abuts an abutting part of the checking device by energizing the solenoid;

checking the conduction of the connector terminals while holding the conduction checking part in the conduction check position; and releasing the solenoid to return to the initial state.

10. A connector terminal checking device comprising:

a base having a bottom wall and upstanding elongated side walls and an end closure wall joined to said bottom wall to form a channel having an open end facing said closure wall, and a pivot pin extending between said side walls and said open end;

a stay disposed in said channel and being rotatable about an axis provided by said pivot pin;

a conduction checking part supported by said stay so as to rotate between a stand-by position where a connector having connector terminals is attached and detached and a conduction check position where the conductive condition of said connector terminals is checked, said conduction checking part being provided with test pins for checking the terminal conduction;

a compression spring disposed between said stay and said base, disposed from said pivot pin in said channel and adapted to urge said stay outward from said base between said check position and said standby position;

an abutting part attached to said base so as to come into contact with a rear end of said connector mounted on said conduction checking part disposed in said conduction check position;

means for urging said conduction checking part against said stand-by position; and means for holding said conduction checking part in said conduction check position when checking the conduction of said connector terminals.

11. The connector terminal checking device of claim 10, wherein the compression spring is a first compression spring and said urging means comprises a second compression spring.

12. The connector terminal checking device of claim 10, wherein said holding means comprises a solenoid.

13. The connector terminal checking device of claim 10, wherein said abutting part has a checker for detecting presence of accessories of said connector to be checked.

14. The connector terminal checking device of claim 10, wherein said abutting part comprises abutting portions which are constructed so as to come into contact with the rear end of said connector and which are provided on respective upper ends thereof with slants for facilitating the contact of said abutting part with the rear end of said connector.

15. The connector terminal checking device of claim 10, wherein said conduction checking part is provided with an engagement pin and wherein said holding means further comprises a lock lever associated with said solenoid to allow said engagement pin to be engaged.

16. The connector terminal checking device of claim 10, wherein said lock lever is provided with a recess which is capable of engaging with said engagement pin.

17. The connector terminal checking device of claim 10, wherein said lock lever is provided in the vicinity of said recess with a slant for facilitating the engagement of said engagement pin into said recess.

18. The method of claim 9, further including the step of detecting presence of connector accessories with an accessory presence checker.

* * * * *